(12) United States Patent
Cain, III et al.

(10) Patent No.: US 9,760,133 B2
(45) Date of Patent: Sep. 12, 2017

(54) LOCKING POWER SUPPLIES

(71) Applicant: INTERNATIONAL BUSINESS MACHINES CORPORATION, Armonk, NY (US)

(72) Inventors: Harold W. Cain, III, Katonah, NY (US); David M. Daly, Yorktown Heights, NY (US); Jose E. Moreira, Irvington, NY (US)

(73) Assignee: International Business Machines Corporation, Armonk, NY (US)

( * ) Notice: Subject to any disclaimer, the term of this patent is extended or adjusted under 35 U.S.C. 154(b) by 649 days.

(21) Appl. No.: 14/286,291

(22) Filed: May 23, 2014

(65) Prior Publication Data

US 2015/0338891 A1 Nov. 26, 2015

(51) Int. Cl.
*G06F 1/18* (2006.01)
*H05K 7/14* (2006.01)
(Continued)

(52) U.S. Cl.
CPC .............. *G06F 1/183* (2013.01); *G06F 1/182* (2013.01); *G06F 11/00* (2013.01); *G06F 11/30* (2013.01);
(Continued)

(58) Field of Classification Search
CPC .......... G06F 1/182; G06F 1/183; G06F 11/00; G06F 11/30; H05K 7/1409; H05K 7/1492;
(Continued)

(56) References Cited

U.S. PATENT DOCUMENTS

| 4,214,172 A | 7/1980 | See |
| 6,175,491 B1 | 1/2001 | Park |

(Continued)

FOREIGN PATENT DOCUMENTS

| CN | 2622754 | 6/2004 |
| JP | 11164475 | * 11/1999 |

(Continued)

OTHER PUBLICATIONS

Walker, "Redundant power supplies and parallel operation of power supply units", PULS, Application Note AN 18.01. en, http://www.pulspower.com/pdf/18_2004_05_parallel_redundanz_en.pdf, May 18, 2004.

(Continued)

*Primary Examiner* — Rexford Barnie
*Assistant Examiner* — Toan Vu
(74) *Attorney, Agent, or Firm* — Scully, Scott, Murphy & Presser, P.C.; Rabin Bhattacharya, Esq.

(57) ABSTRACT

There is provided an apparatus, a method and computer program product for managing one or more components of an electronic machine. A user connects one or more components to an electronic machine in parallel. The electronic machine determines whether the components are failed. A latch device, attached to each component, automatically locks one or more of the components to the electronic machine if the one or more of the components are not failed. The electromechanical latch automatically releases the one or more of the components from the electronic machine if the one or more of the components are failed.

16 Claims, 10 Drawing Sheets

(51) Int. Cl.
*G06F 11/00* (2006.01)
*G06F 11/30* (2006.01)

(52) U.S. Cl.
CPC ......... *H05K 7/1409* (2013.01); *H05K 7/1492* (2013.01); *H05K 7/1498* (2013.01); *Y10T 307/469* (2015.04); *Y10T 307/696* (2015.04)

(58) Field of Classification Search
CPC .............. H05K 7/1498; Y10T 307/469; Y10T 307/696
USPC .......................................................... 307/39
See application file for complete search history.

(56) References Cited

U.S. PATENT DOCUMENTS

| | | | |
|---|---|---|---|
| 6,268,664 B1 * | 7/2001 | Rolls | H05K 7/20581 307/117 |
| 6,577,501 B2 | 6/2003 | Lin | |
| 6,680,840 B2 | 1/2004 | Brooks | |
| 7,643,306 B2 | 1/2010 | Karstens | |
| 2003/0043561 A1 | 3/2003 | Brooks | |
| 2004/0109374 A1 * | 6/2004 | Sundar | H02J 1/08 365/226 |
| 2008/0266740 A1 * | 10/2008 | Smith | H02J 1/10 361/91.5 |
| 2011/0291846 A1 | 12/2011 | Burdenko | |

FOREIGN PATENT DOCUMENTS

| | | | |
|---|---|---|---|
| JP | 2005025325 | * | 1/2005 |
| JP | 2009123314 | * | 6/2009 |

OTHER PUBLICATIONS

"Solenoid for opening door latch", Stack Exchange, http://electronics.stackexchange.com/questions/65168/solenoid-for-opening-door-latch, last printed Apr. 8, 2014 10:50 AM.

* cited by examiner

LOCKING POWER SUPPLIES

BACKGROUND

This disclosure relates generally to power supplies, and particularly to power supplies with electromechanical latches.

BACKGROUND OF THE INVENTION

Many computing server systems have redundant power supplies, which allow the server systems to continue operating even when a power supply fails. However, when a maintenance service is called to replace a failed power supply, sometimes a repair person disconnects a wrong (i.e., working) power supply and the server system crashes due to lack of sufficient electricity.

SUMMARY

In one embodiment, there is provided an apparatus and a method for managing one or more components of an electronic machine. A user connects one or more components to an electronic machine in parallel. Each component provides a function to the electronic machine. The electronic machine determines whether the components are failed. A latch device, attached to each component, automatically locks one or more of the components to the electronic machine if the one or more of the components are not failed. In order to automatically lock, the latch device selectively moves between a lock position and a release position based on the determination. The locking prevents the one or more of the components from disconnecting from the electronic machine. The latch device automatically releases the one or more of the components from the electronic machine if the one or more of the components are failed. In order to release, the latch device moves to the release position.

In one embodiment, a method for managing one or more components of an electronic machine comprises connecting one or more components to the electronic machine in parallel. Each component provides a function to the electronic machine. Whether the components are failed is determined. One or more of the components are automatically locked to the electronic machine if the one or more of the components are not failed. The locking includes: using a latch device, attached to each component, which selectively moves between a lock position and a release position based on the determination. The locking prevents the one or more of the components from disconnecting from the electronic machine. The one or more of the components are automatically released from the electronic machine if the one or more of the components are failed. The releasing includes moving the latch device to the release position

BRIEF DESCRIPTION OF THE DRAWINGS

These and other objects, features and advantages of the present invention will become apparent from the following detailed description of illustrative embodiments thereof, which is to be read in connection with the accompanying drawings, in which.

DETAILED DESCRIPTION

Figure 8:
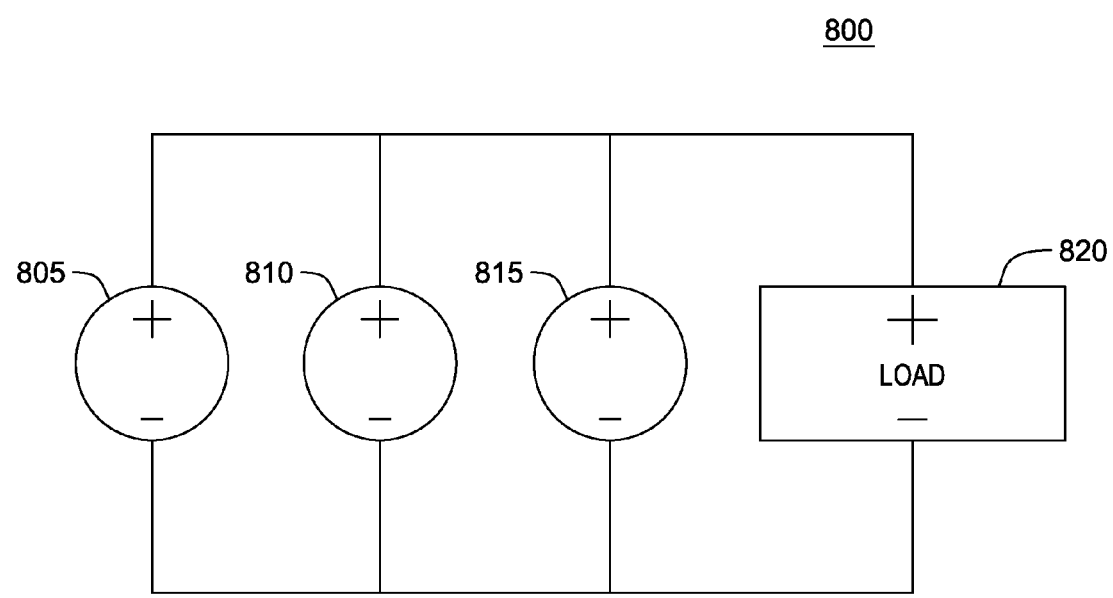
FIG. 8 illustrates multiple power supplies connected in parallel and feeding a single load (e.g., a computer server equipment)

Computing server systems use multiple power supplies to provide electricity to the server systems at the appropriate voltages, e.g., 110V or 220V, etc., and with sufficient current, e.g., 0.7 A, etc. A power supply includes, but is not limited to: (1) a connection cord with possibly an on and off switch; (2) one or more voltage converting devices powering one or more electronic machine; (3) monitoring and protection circuits. Power supplies may have lower reliability than other parts or components of the server systems. Power supplies can be self monitoring, and indicate when they have failed, e.g., by using one or more sensors (for example, voltage meters, etc.). For example, if a voltage meter of a power supply indicates that an electric voltage measurement of electricity, which is provided from that power supply, is less than a threshold voltage, it is determined that that power supply is failed. Multiple redundant power supplies can used to increase a reliability of the system, as shown in FIG. 8: for example, a failure of a power supply 805 may not affect an operation of a corresponding server system 820 because a one or more redundant power supplies 810-815 can provide electricity that has been provided from the failed power supply. For example, a computing server system may have a n+k number of power supplies (where n and k are positive integer numbers) and may require that at least n number of power supplies operate normally for a normal operation of the server system. In this example, so long as k or fewer power supplies fail, the server system is able to operate normally. A normal operation of a power supply includes, but is not limited to: generating or providing electricity whose electric power measurement, electric voltage measurement or electric current measurement is between two pre-determined thresholds. A normal operation of a computing server system includes: (1) running software applications installed in that computing server system without an error or a warning, (2) providing a necessary level of performance, and (3) performing its own self-checking monitoring functions. Depending on the design of the redundant power supplies, n and k can take any desired positive integer values. Example values for n and k are n=1 and k=1.

In a computing server system with n+k number of power supplies where n is 1 and k is 1, when a power supply fails, the failed power supply needs to be replaced before there is another power supply failure. A failure of a power supply includes, but is not limited to: (1) no electric current flows from that power supply, as measured; (2) no electric voltage provided from the power supply, as measured; (3) an electric voltage measurement, an electric current measurement or an electric power measurement of electricity, provided from the power supply, is lower than a first pre-determined threshold; (4) the electric voltage measurement, the electric current measurement or the electric power measurement of electricity, provided from the power supply, is higher than a second pre-determined threshold, and so on. A failed power supply can be replaced with a new power supply while the server system is normally operating. A service technician may physically remove the failed power supply and replace it with the new power supply. In one embodiment, a normally operating (i.e., working) power supply cannot be removed unless there are enough other working power supplies to keep the server system running.

Figure 1:
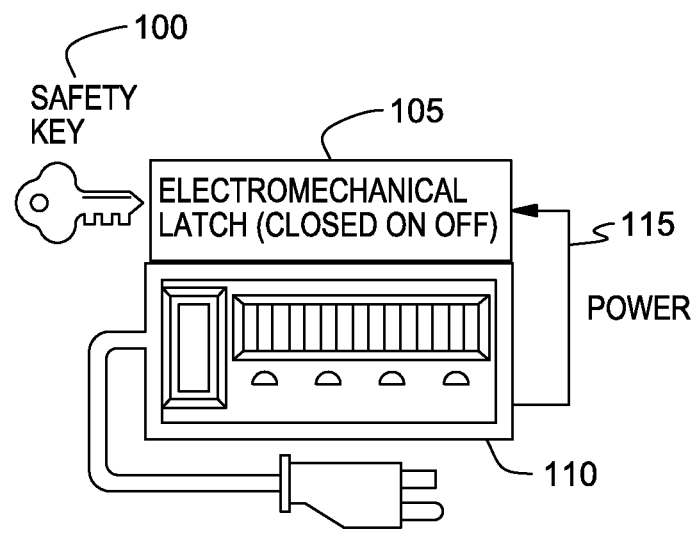
FIG. 1 illustrates an example power supply with an electromechanical latch in one embodiment.
Figure 4:
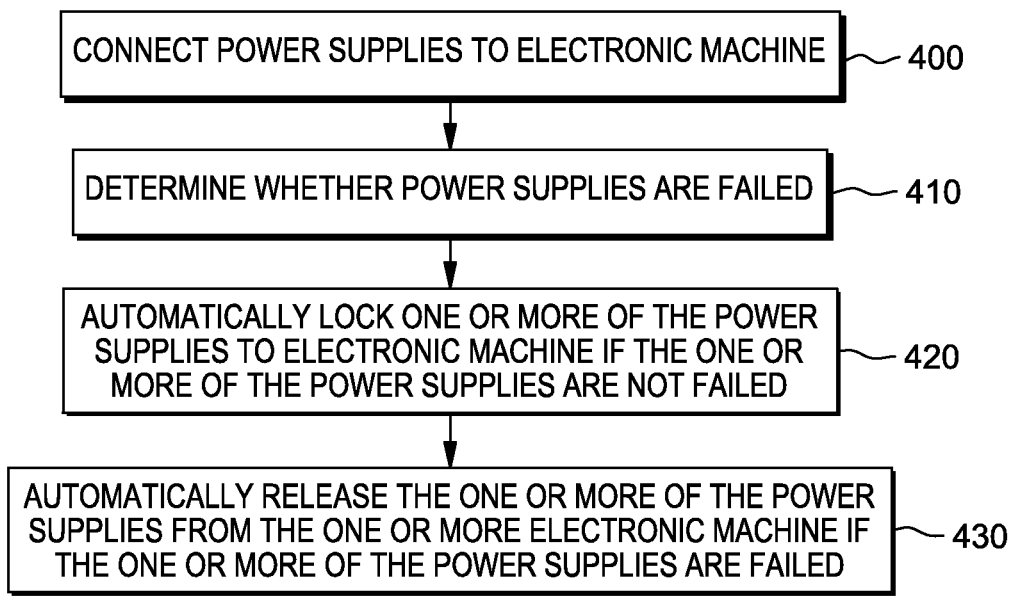
FIG. 4 illustrates a flowchart that describes method steps for managing one or more power supplies in one embodiment.

FIG. 4 illustrates a flowchart that describes method steps for managing one or more power supplies in one embodiment. FIG. 1 illustrates an example power supply with an electromechanical latch in one embodiment. At 400, power supplies are connected to one or more electronic machine (not shown), e.g., one or more computing server systems, etc., in parallel. Each power supply (e.g., a power supply 110 shown in FIG. 1, etc.) provides electricity to the one or more electronic machine. At 410, sensors (e.g., voltage meters, etc.) (not shown), each attached to a corresponding power supply, determine whether the corresponding power supplies are failed. The sensors measure electric powers, electric voltages and electric currents provided from the power supplies to the one or more electronic machine.

At 420, electromechanical latches (e.g., an electromechanical lock 105 shown in FIG. 1, etc.), each attached to a corresponding power supply, automatically lock one or more of the power supplies to the one or more electronic machine if the one or more of the power supplies are not failed. In order to lock a power supply to the one or more electronic machine, a corresponding electromechanical latch, of that power supply, selectively moves between a lock position and a release position based on the determination of the failure of the power supply. The locking the one or more power supplies prevent the one or more of the power supplies from disconnecting from the one or more electronic machine. At 430, the electromechanical latches automatically release the one or more of the power supplies from the one or more electronic machine if the one or more of the power supplies are failed. The releasing a power supply includes: moving a corresponding electromechanical latch to the release position. The releasing the one or more power supplies disconnects the one or more failed power supplies from the one or more electronic machine. In one embodiment, a user may manually operate an electromechanical latch to lock or release a corresponding power supply to (or from) the electronic machine by using a safety key (e.g., a safety key 100 shown in FIG. 1, etc.), e.g., a combinations, a sequence of numbers, etc., which correspond to that electromechanical latch. In one embodiment, the user may need to (temporarily) stop providing electricity to the electronic machine before disconnecting a power supply from the electronic machine.

Figure 5:
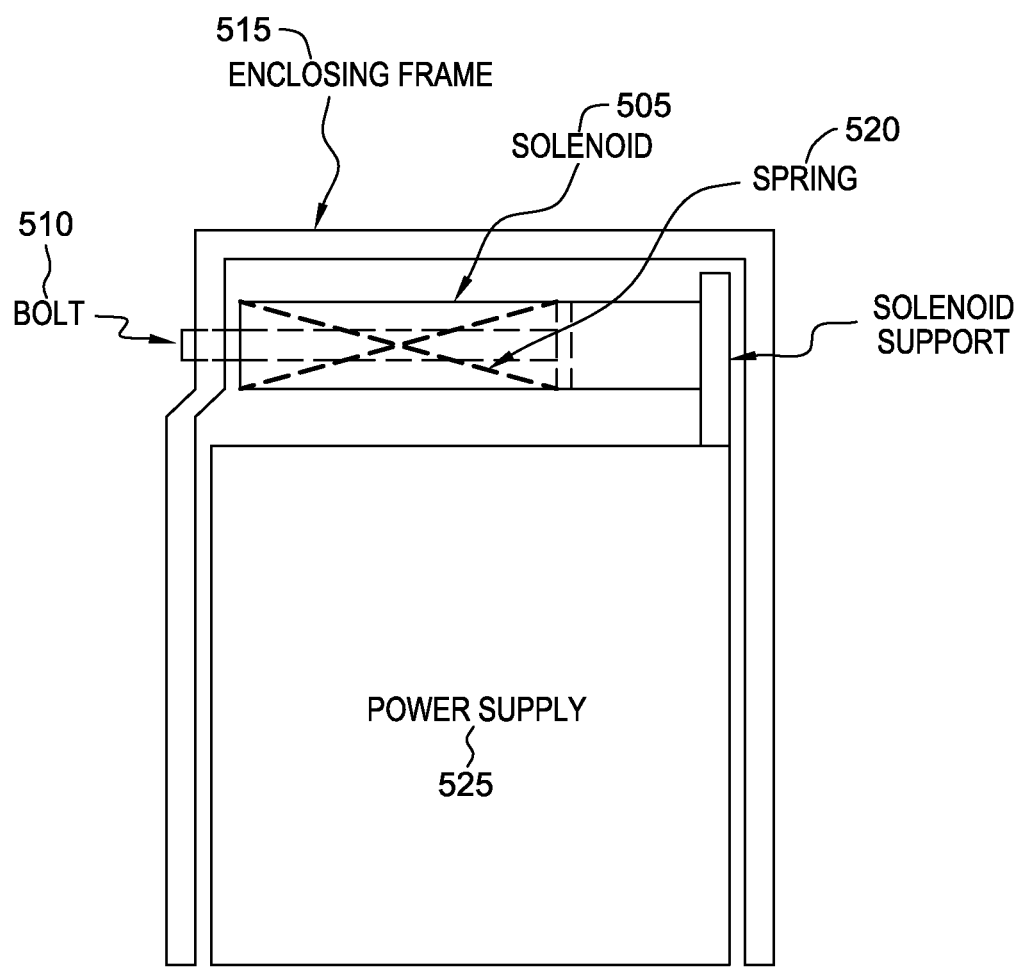
FIGS. 5-6 illustrate an example power supply with an electromechanical latch in one embodiment.
Figure 7:
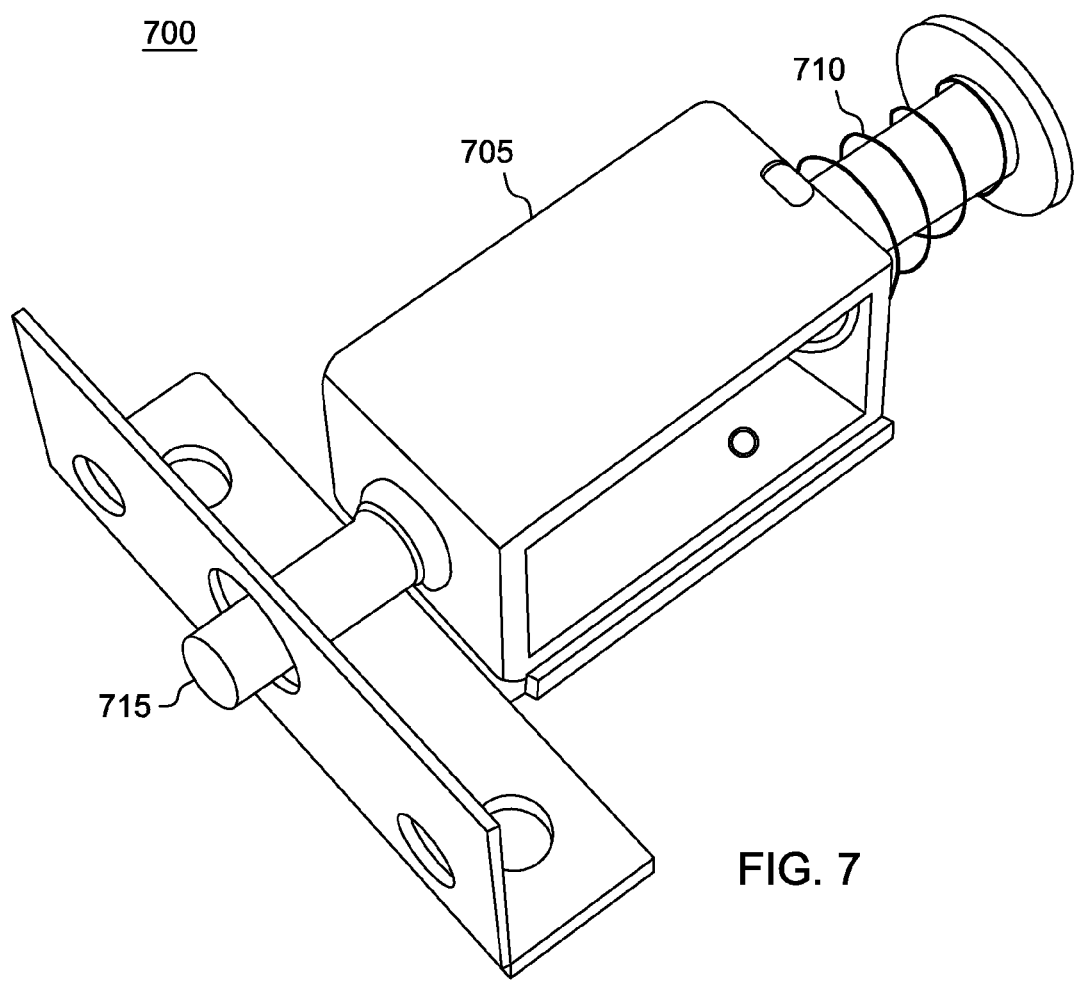
FIG. 7 illustrates an example electromechanical latch in one embodiment.

FIG. 5 illustrates an example electromechanical latch. When a solenoid 505 is powered (by a power supply 525), a bolt 510 protrudes and locks into an enclosing frame 515 and hence preventing disconnection from a connected electronic machine. When the power supply 525 fails, a spring 520 retracts the bolt 510, which unlocks the power supply 525. FIG. 7 also illustrates an example electromechanical solenoid latch 700. The example electromechanical latch 700 includes, but is not limited to: a bolt 715, a solenoid 705 and a spring 710 that operates in the manner as discussed above.

In one embodiment, the electronic machine does not communicate, e.g., exchange electric signals, with the electromechanical latches in order to determine whether to release of the latches or close of the latches. Only the measured electric power, electric current or electric voltage of electricity, provided from a power supply, determines whether to release or close (i.e., lock) a corresponding electromechanical latch. An electromechanical latch and a corresponding power supply are connected to each other via a conductor (e.g., an electric wire 115, etc.). The corresponding power supply may provide electricity (or control signal) to that electromechanical latch via the electric wire. The provided electricity (or control signal) may be used for operating (i.e., locking and releasing) the electromechanical latch from its connected power supply.

In one embodiment, there exists no communication between power supplies. Each power supply can lock itself to the electronic machine, e.g., based on an electricity power measurement of electricity provided from the each power supply, e.g., by using a corresponding electromechanical latch.

In order to lock a power supply to the electronic machine, the power supply applies electricity to a solenoid (e.g., solenoid 505 shown in FIG. 5, etc.) in a corresponding electromechanical latch. In response to the applied electricity, an electric voltage of the solenoid increases. Upon the electric voltage of the solenoid reaching a pre-determined threshold, the corresponding electromechanical latch locks that power supply to the electronic machine. In one embodiment, a sensor device (e.g., a current or voltage meter, etc.) attached to the power supply or the electronic latch may measure and/or monitor the electric voltage of the electricity provided from the power supply.

In order to release a power supply from the electronic machine, the powers supply stops providing electricity to the electronic machine and to the solenoid in a corresponding electromechanical latch. Since the electricity is no longer provided to the solenoid, the corresponding electromechanical latch releases that power supply from the electronic machine. In one embodiment, the sensor device (e.g., a current or voltage meter, etc.) attached to the power supply or the electronic latch may measure and/or monitor the electric voltage of the electricity provided from the power supply.

In one embodiment, the number of the power supplies includes a n number of necessary power supplies and a k number of redundant power supplies, where the n is a positive integer number, the k is another positive integer number. The n or more number of power supplies are necessary to operate the one or more electronic machine, and failures of the k or less number of power supplies are allowed to operate the one or more electronic machine.

Figure 2:
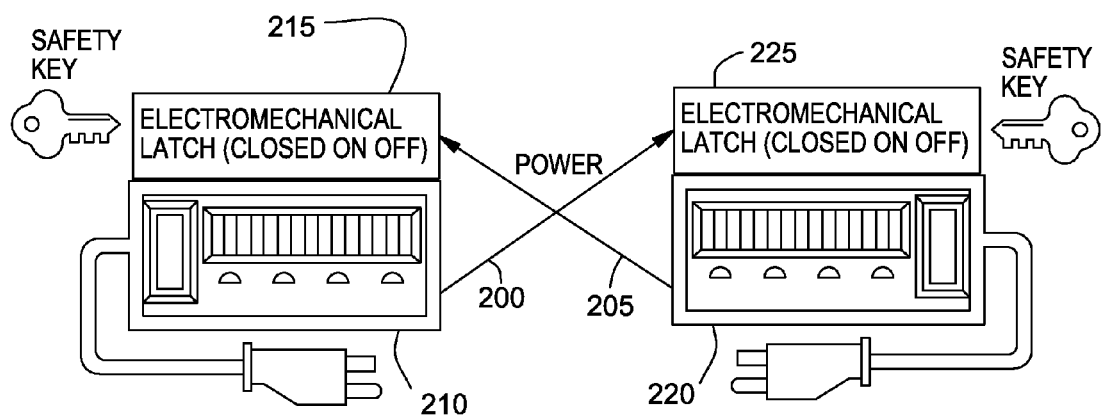
FIG. 2 illustrates exemplary interlocking power supplies in one embodiment.
Figure 6:
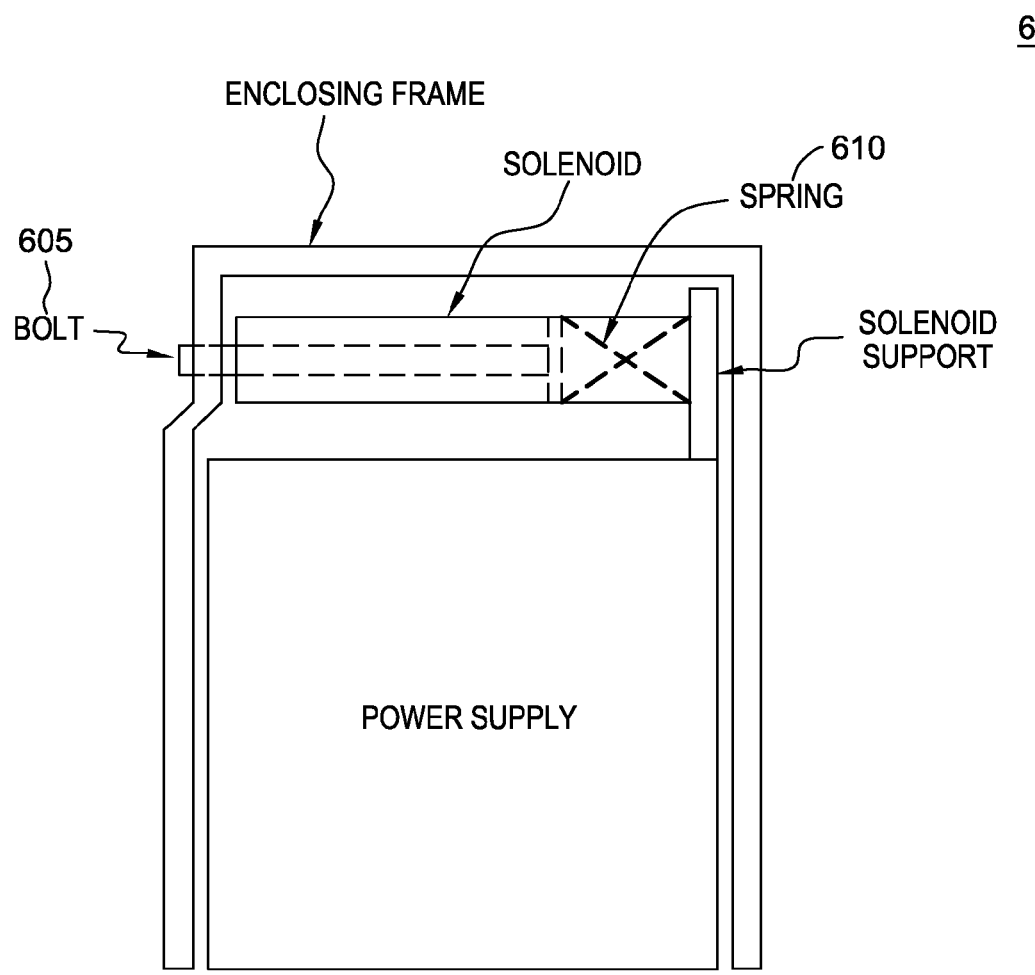

FIG. 2 illustrates interlocking power supplies in one embodiment. For example, as shown in FIG. 2, a first power supply 210 and a second power supply 220 are connected each other via conductors, e.g., electric wires 200-205, and affects each other: a normally operating power supply may release an electromechanical latch of another power supply. For example, the first power supply 210 provides electricity to an electromechanical latch 225 of a second power supply. The second power supply may be situated adjacent the first power supply. The second power supply 220 provides electricity to an electromechanical latch 215 of the first power supply 210. The electromechanical latch 225 locks the second power supply 220 to the electronic machine if the first power supply 210 is failed. The electromechanical latch 225 releases the second power supply 220 if the first power supply 210 is not failed. The electromechanical latch 215 locks the first power supply 210 to the electronic machine if the second power supply 220 is failed. The electromechanical latch 215 releases the first power supply 210 if the second power supply 220 is not failed. An example electromechanical latch 600 in this embodiment is shown in FIG. 6. This electromechanical latch 600 operates in the opposite way of the electromechanical latch 500 in FIG. 5: applying electric power retracts the bolt and pulls the bolt 605 away from a corresponding lock, whereas a spring 610 pushes the bolt 605 in when there is no electric power supplied.

In a further embodiment, the interlocking of the power supplies includes, but is not limited to: (1) disconnecting an unfailed power supply (i.e., normally operating power supply) from the electronic machine if the n or more number of power supplies are not failed; (2) automatically locking one or more of the power supplies from the electronic machine if the one or more of the power supplies are failed; and (3) automatically releasing one or more of the power supplies from the electronic machine if the one or more of the power supplies are not failed.

Sensors of the power supplies determine whether one or more of the power supplies are failed. Upon determining that the one or more power supplies are failed, the user manually releases corresponding electromechanical latches of the one or more failed power supplies. The user replaces the one or more failed power supplies with unfailed power supplies.

Upon determining that the one or more of the power supplies are unfailed, the user manually releases corresponding electromechanical latches of the one or more unfailed power supplies. The user replaces the one or more unfailed power supplies with new or used power supplies.

Figure 3:
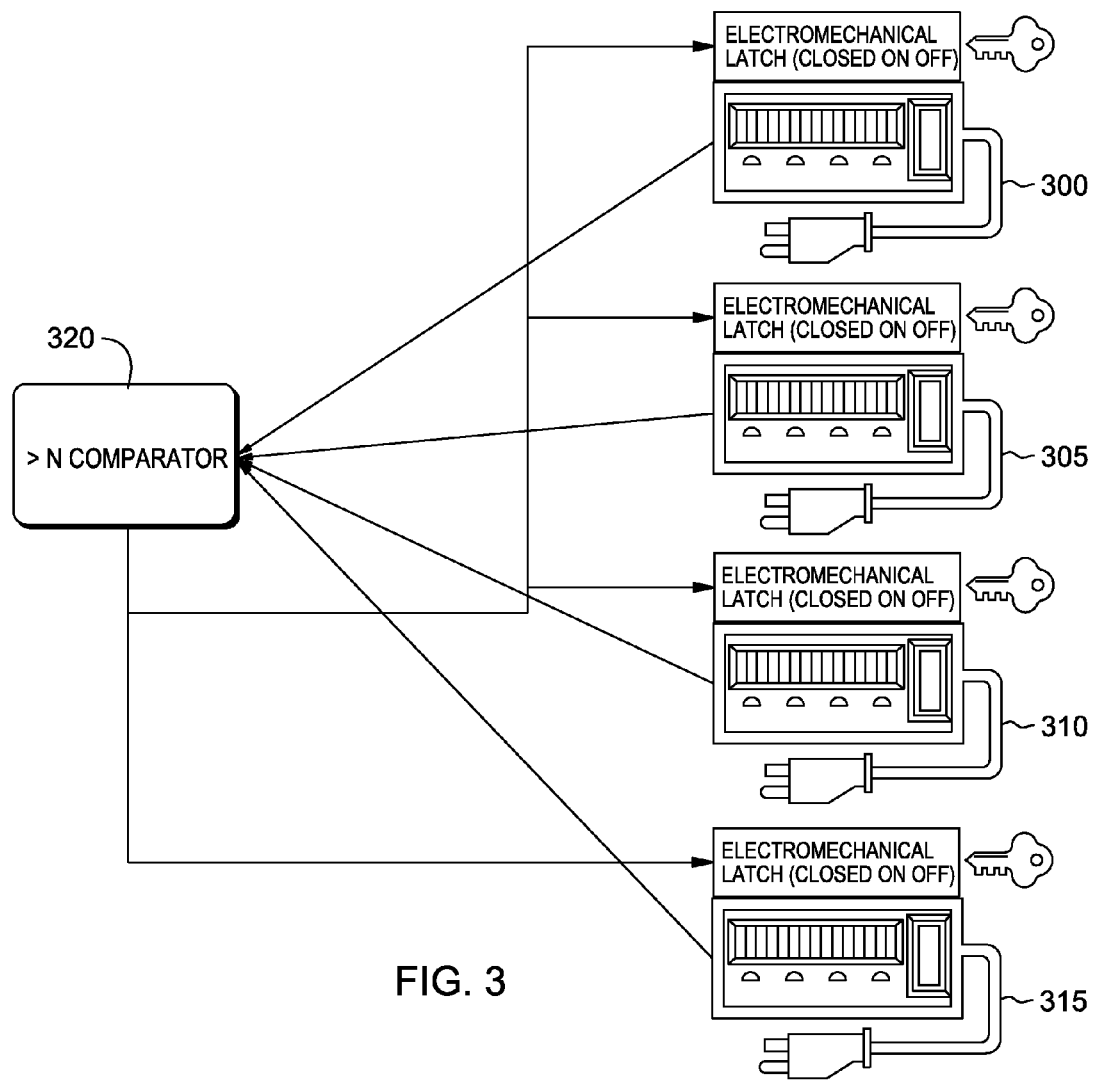
FIG. 3 illustrates n+1 number of interlocking power supplies in one embodiment.

FIG. 3 illustrates n+1 number of interlocking power supplies in one embodiment. An electric circuit is connected to each of the power supplies 300-315 in parallel. The electric circuit 320 implements logic to concurrently monitor and compare electric power measurement, electric voltage measurement or electric current measurements of electricity provided from each power supply to two predetermined thresholds, e.g., the first pre-determined threshold and the second pre-determined threshold. The sensors of the power supplies 300-315 determine, based on the comparison, the number of power supplies that operates normally. The electric circuit 320 controls, based on the determination, an operation of each power supply. For example, the electric circuit 320 implements a logic to determine whether n number or more than n number of power supplies operate normally. The electric circuit 320 releases all electromechanical latches of all the power supplies if the n number or more than n number of power supplies normally operate. In another example, the electric circuit 320 determines which power supply does not operate normally and which power supply operate normally. The electric circuit 320 locks electromechanical latches of power supplies which operate normally. In one embodiment, if any of the power supplies 300-315 fails, electromechanical latches of all other power supplies, which include working or non-working power supplies, are locked.

In a further embodiment, assume that there exist n+k number of power supplies connected to the electronic machine. The electric circuit 320 may generate a signal, e.g., an LED light, etc., if n or more than n number of power supplies operate normally. If only n number of power supplies operate normally, i.e., k number of redundant power supplies do not operate normally, the user can remove (i.e., disconnect) no unfailed power supply among the n+k number of power supplies. If more than n number of power supplies operate normally, the user can disconnect any of the normally operating power supplies.

Figure 9:
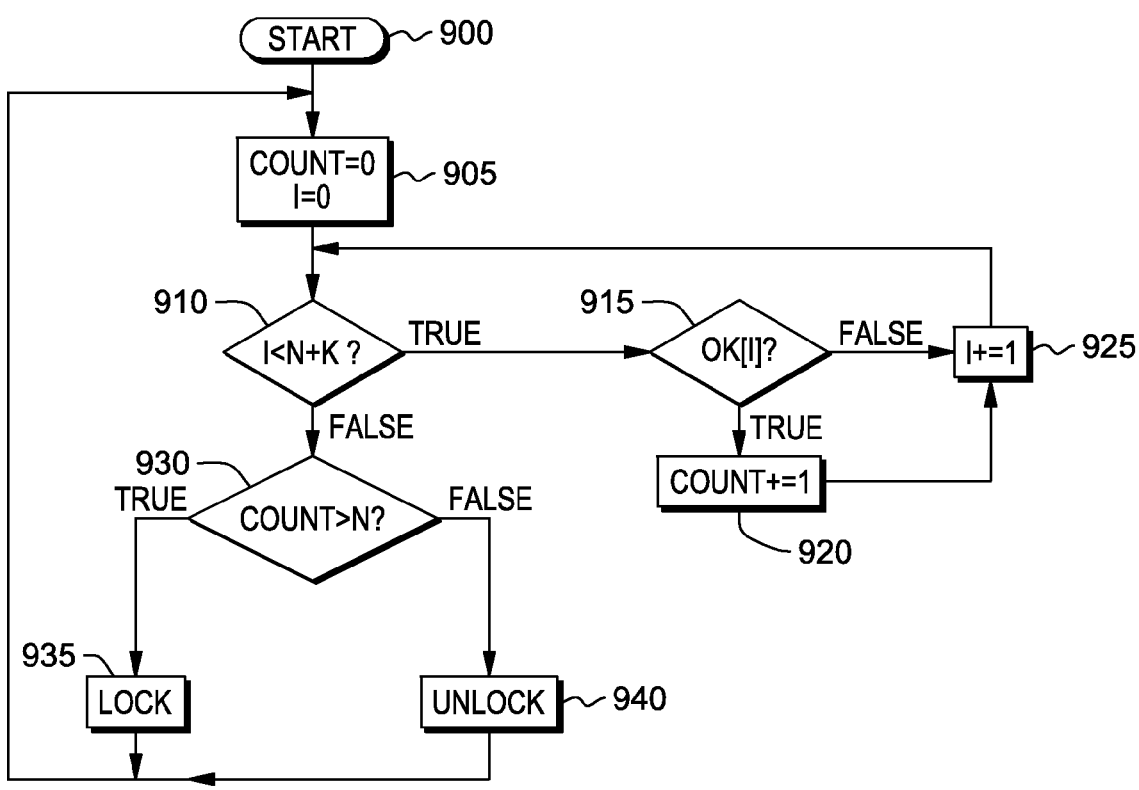
FIG. 9 illustrates a flowchart that describes the process for managing one or more power supplies in a general n+k redundant power supplies configuration.

The flowchart in FIG. 9 illustrates a process by which the monitoring circuit 320 in FIG. 3 works. At 905, the number of normally operating power supplies ("count") is initialized to zero. The number of total power supplies ("I") is initialized to zero. At 910, each power supply I sends a signal OK[I] to the circuit 320 to indicate if the each power supply I has failed or not. At 915-920, if the OK[I] signal indicates a positive signal (T), a corresponding power supply which emitted that positive signal (T) is operating normally. The circuit 320 increments the value of the "count" at 920. If the OK[I] signal indicates a negative signal (F), the corresponding power supply is failed. At 925, the circuit 320 increments the value of the "I" to determine status of the next power supply (e.g., I+1). The circuit 320 repeats steps 910-925 until all the power supplies send the OK[I] signals to the circuit 320. At 930, the circuit 320 counts how many positive signals are present among all the power supplies. If the number of positive signals is greater than the threshold "N," then circuit 320 sends an UNLOCK signal 940 (i.e., a signal for unlocking or releasing corresponding power supplies from the electronic machine) to all the power supplies. Otherwise, the circuit 320 sends a LOCK signal 935 (i.e., a signal for preventing corresponding power supplies from being disconnected from the electronic machine) to the power supplies. Only power supplies that are unfailed can be locked to the electronic machine. A failed power supply can be removed from the electronic machine.

In an alternative embodiment, a computing system may restrict a removal of a component(s) from the electronic machine. For example, the computing system may not allow a replacement or removal of a component if the removal or the replacement alter a current state (i.e., normally operating, etc.) of the electronic machine: a removal of a normally operating power supply may crash the electronic machine to which that power supply provides electricity. In a further embodiment, the component(s) is a power supply that provides electricity to the electronic machine. The components lock (i.e., connect, etc.) themselves into the electronic machine when those components are normally operating, e.g., by using a control system or a robot (not shown) that regulates movements of the components. The components may disconnect themselves upon failures or non-operations of those components. Sensors attached to the components may detect the failures of those components based on signals, or absence of those signals, originating from the failed components.

In a further embodiment, there exists n+k number of components in the electronic machine. If n number of components are needed for a normal operation of the electronic machine, a control system (e.g., electric circuit 320 in FIG. 3) connected to the electronic machine monitors the n+k number of the components. The control system locks the n number of normally operating components in place (i.e., the n number of normally operating components cannot be removed from the electronic machine) when there are only n number of remaining components which normally operate. The control system determines whether there exist n number of or fewer normally operating components. Each normally operating component is locked in a corresponding place if the control system detects that there exist n number of or fewer normally operating components in the electronic machine.

If a component(s) is locked in place, the user may push a button (not shown) on a corresponding electromechanical latch, which is attached to that component, to initiate unlocking of that component before removing that component from the electronic machine. The user may actually unlock the corresponding electromechanical latch only if a removal of that component would not alter a current state of the electromechanical machine. The user may enter a safety key to the electromechanical latch in order to unlock (i.e., release) that component. An output of a component in the electronic machine is a logic that controls an operation of a corresponding electromechanical latch. For example, a power supply voltage may be used to unlock or lock a corresponding electromechanical latch.

While the invention has been particularly shown and described with respect to illustrative and preformed embodiments thereof, it will be understood by those skilled in the art that the foregoing and other changes in form and details may be made therein without departing from the spirit and scope of the invention which should be limited only by the scope of the appended claims.

In particular, the embodiment described here regarding power supplies can be readily extended to other types of electronic machine components. The types of components to which it applies include, but are not restricted to, external disk drives, processor cards, memory cards, network cards.

Figure 10:
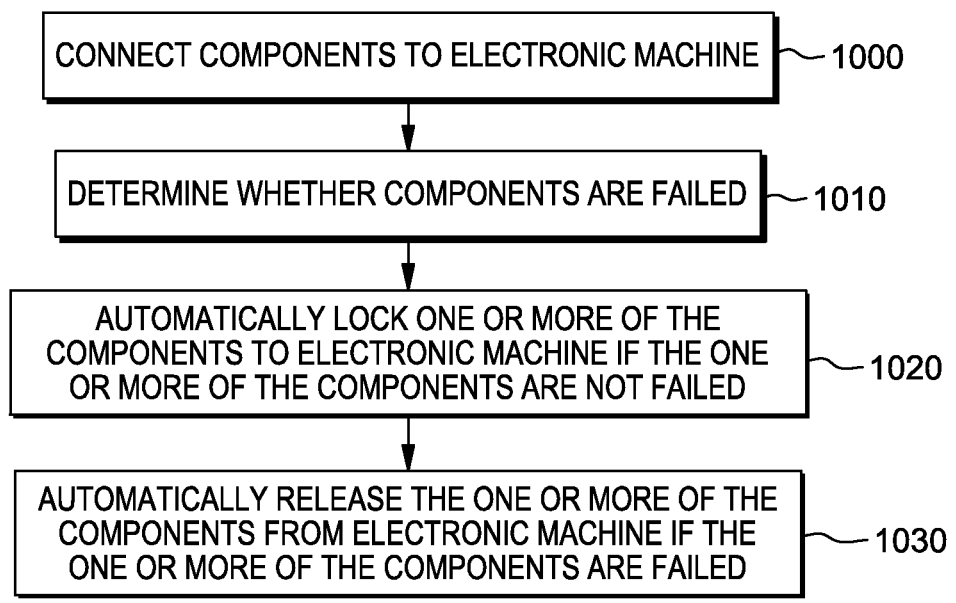
FIG. 10 illustrates a flowchart that describes a method for managing one or more components of an electronic machine in one embodiment.

In this embodiment, there is provided an apparatus, a method and a computer program product for managing one or more components of an electronic machine, e.g. a computing system such as a mainframe computer, server, and the like. FIG. 10 illustrates a flowchart that describes the method for managing the one or more components of the electronic machine. At 1000, a user connects the one or more components to the electronic machine in parallel. A component includes, but is not limited to: memory cards, network cards, processor cards, power supplies, cooling fans, etc. Each component provides a function to the electronic machine.

At 1010, the electronic machine determines whether the components are failed. For example, in order to determine whether a network card operates normally, the electronic machine may send ping command to a web site. Upon receiving a response to the ping command, the electronic machine determines that the network card operates normally. In order to determine whether a disk drive operates normally, the electronic machine may run a pre-installed error checking tool, e.g., Microsoft® Windows® disk error-checking tool. Upon receiving an error message from the running of the pre-installed error checking tool, the electronic machine determines that there exists an error in the disk drive. Alternatively, the electronic machine uses one or more sensors which monitor operations of the components in order to determine whether the components are failed.

At 1020, an electromechanical latch, attached to each component, automatically locks one or more of the components to the electronic machine if the one or more of the components are not failed. In order to automatically lock, the electromechanical latch selectively moves between a lock position and a release position based on the determination. The locking prevents the one or more of the components from disconnecting from the electronic machine.

At 1030, the electromechanical latch automatically releases the one or more of the components from the electronic machine if the one or more of the components are failed. In order to release, the electromechanical latch moves to the release position.

The circuitry of FIG. 2 may be controlled by discrete hardware logic devices, a programmed hardware processor device, or a computer system configured to run instructions included in a computer readable medium for running the methods of FIG. 9. Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with a system, apparatus, or device running an instruction.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with a system, apparatus, or device running an instruction.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may run entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which run via the processor of the computer or other programmable data processing apparatus, create means for implementing the functions/acts specified in the flowchart and/or block diagram block or blocks. These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which run on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more operable instructions for implementing the specified logical function (s). It should also be noted that, in some alternative implementations, the functions noted in the block may occur out of the order noted in the figures. For example, two blocks shown in succession may, in fact, be run substantially concurrently, or the blocks may sometimes be run in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

What is claimed is:

1. A method for managing one or more power supplies, the method comprising:
    connecting n number of necessary power supplies and k number of redundant power supplies to one or more electronic machine in parallel, each power supply providing electricity to the one or more electronic machine, wherein n is a positive integer number of power supplies being necessary to operate the electronic machine, and k is another positive integer number, wherein a failure of the k or less number of power supplies will still keep the electronic machine operating;
    interlocking the power supplies, the interlocking including: connecting the n and k power supplies together so that each power supply affects each other;
    determining whether the power supplies are failed;
    automatically locking one or more of the power supplies to the one or more electronic machine if the one or more of the power supplies are not failed, the locking including: using a latch device, attached to each power supply, which selectively moves between a lock position and a release position based on the determination, the locking preventing the one or more of the power supplies from disconnecting from the one or more electronic machine when the one or more of the power supplies are not failed, wherein a normally operating power supply releases the latch device of another power supply; and
    automatically releasing the one or more of the power supplies from the one or more electronic machine if the one or more of the power supplies are failed, the releasing including moving the latch device to the release position.

2. The method according to claim 1, wherein the determining includes:
    measuring electric powers, electric voltages and electric currents provided from the power supplies.

3. The method according to claim 1, wherein the releasing includes:
    disconnecting the one or more failed power supplies from the one or more electronic machine.

4. The method according to claim 1, wherein the locking and the releasing include:
    manually operating the latch device by using a safety key.

5. The method according to claim 1, wherein the interlocking includes:
    disconnecting an unfailed power supply from the one or more electronic machine if n+1 or more number of power supplies are not failed.

6. The method according to claim 1, further comprising:
    automatically locking the one or more of the power supplies from the one or more electronic machine if the one or more of the power supplies are failed; and
    automatically releasing the one or more of the power supplies from the one or more electronic machine if the one or more of the power supplies are not failed.

7. The method according to claim 6, wherein the determining includes:
    providing electricity to a latch device of one of the power supplies from another of the power supplies;
    determining whether the another power supply is failed;
    locking the one power supply if the another power supply is failed; and
    releasing the one power supply if the another power supply is not failed.

8. The method according to claim 1 further comprising:
    providing an electric circuit which is connected to the power supplies in parallel,
    wherein the electric circuit performs:
    for each power supply, concurrently comparing an electric power measurement against pre-determined lower and higher electric power thresholds, comparing an electric voltage measurement against pre-determined lower and higher electric voltage thresholds, or comparing an electric current measurement of electricity provided from each power supply against pre-determined lower and higher electric current thresholds; and
    determining, based on the comparison, a number of power supplies that operates
    normally, the normal operation of a power supply includes: generating electricity whose electric power measurement, electric voltage measurement or electric current measurement is between the respective lower and higher pre-determined electric power thresholds, lower and higher electric voltage thresholds or lower and higher electric current thresholds;
    controlling, based on the determination, an operation of each power supply.

9. The method according to claim 8, wherein the controlling includes:
    determining whether n number or more than n number of power supplies operate normally; and
    releasing all latch devices of all the power supplies if the n number or more than n number of power supplies normally operate.

10. The method according to claim 8, wherein the controlling includes:

determining which power supply does not operate normally and which power supply operates normally;

locking latch devices of power supplies which operate normally.

11. The method according to claim 1, wherein the locking and the releasing include: manually operating the latch device by using a safety key.

12. An apparatus for managing one or more power supplies, the apparatus comprising:

n number of necessary power supplies and k number of redundant power supplies that are connected in parallel to one or more electronic machine and provide electricity to the one or more electronic machine, wherein n is a positive integer number of power supplies being necessary to operate the electronic machine, and k is another positive integer number, wherein failures of the k or less number of power supplies will still keep the electronic machine operating, said parallel connected n and k power supplies being interlocked and connected together so that each power supply affects each other;

sensors, each attached to a corresponding power supply, determining whether the corresponding power supplies are failed;

latch devices, each attached to a corresponding power supply, automatically locking one or more of the power supplies to the one or more electronic machine if the one or more of the power supplies are not failed, the locking a power supply including: using a corresponding latch device, of the power supply, which selectively moves between a lock position and a release position based on the determination, the locking preventing the one or more of the power supplies from disconnecting from the one or more electronic machine, wherein a normally operating power supply releases the latch device of another power supply; and the latch devices automatically releasing the one or more of the power supplies from the one or more electronic machine if the one or more of the power supplies are failed, the releasing including moving the corresponding latch device to the release position.

13. The apparatus according to claim 12, wherein the power supplies include a n number of necessary power supplies and a k number of redundant power supplies, wherein the n is a positive integer number, the k is another positive integer number.

14. The apparatus according to claim 13, wherein the n or more number of power supplies are necessary to operate the one or more electronic machine, and failures of the k or less number of power supplies are allowed to operate the one or more electronic machine.

15. The apparatus according to claim 14, further comprising:

an electric circuit being connected to the power supplies in parallel, wherein the electric circuit performs:

for each power supply, concurrently comparing an electric power measurement against pre-determined lower and higher electric power thresholds, comparing an electric voltage measurement against pre-determined lower and higher electric voltage thresholds, or comparing an electric current measurement of electricity provided from each power supply against pre-determined lower and higher electric current thresholds;

determining, based on the comparison, a number of power supplies that operates normally, the normal operation of a power supply includes: generating electricity whose electric power measurement, electric voltage measurement or electric current measurement is between the respective lower and higher pre-determined electric power thresholds, lower and higher electric voltage thresholds or lower and higher electric current thresholds; and controlling, based on the determination, an operation of each power supply.

16. The apparatus according to claim 15, wherein in order to perform the controlling, the electric circuit performs:

determining whether n number or more than n number of power supplies operate normally; and releasing all latch devices of all the power supplies if the n number or more than n number of power supplies normally operate.

* * * * *